US008735283B2

(12) United States Patent
Arnold et al.

(10) Patent No.: US 8,735,283 B2
(45) Date of Patent: May 27, 2014

(54) METHOD FOR FORMING SMALL DIMENSION OPENINGS IN THE ORGANIC MASKING LAYER OF TRI-LAYER LITHOGRAPHY

(75) Inventors: John C. Arnold, North Chatham, NY (US); Jennifer Schuler, Philadelphia, PA (US); Yunpeng Yin, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 13/167,176

(22) Filed: Jun. 23, 2011

(65) Prior Publication Data

US 2012/0329272 A1 Dec. 27, 2012

(51) Int. Cl.
*H01L 21/283* (2006.01)

(52) U.S. Cl.
USPC ........... 438/653; 438/618; 438/622; 438/695; 438/717; 438/736

(58) Field of Classification Search
USPC ......... 438/618, 622, 653, 671, 695, 696, 717, 438/736, 952
See application file for complete search history.

(56) References Cited

U.S. PATENT DOCUMENTS

| 6,010,966 | A | 1/2000 | Ionov | |
|---|---|---|---|---|
| 6,524,963 | B1 * | 2/2003 | Zhou et al. | 438/714 |
| 6,991,739 | B2 * | 1/2006 | Kawaguchi et al. | 216/67 |
| 7,560,388 | B2 | 7/2009 | Kim et al. | |
| 7,838,432 | B2 | 11/2010 | Wang et al. | |
| 2003/0008490 | A1 * | 1/2003 | Xing et al. | 438/622 |
| 2004/0175925 | A1 * | 9/2004 | Park | 438/623 |
| 2005/0153538 | A1 * | 7/2005 | Tsai et al. | 438/636 |
| 2007/0178702 | A1 * | 8/2007 | Matsumura et al. | 438/700 |
| 2008/0076260 | A1 * | 3/2008 | Muramatsu et al. | 438/736 |
| 2008/0166870 | A1 * | 7/2008 | Huang et al. | 438/619 |
| 2008/0314521 | A1 | 12/2008 | Sadjadi et al. | |
| 2009/0087992 | A1 * | 4/2009 | Srivastava et al. | 438/701 |
| 2009/0145877 | A1 | 6/2009 | Chang et al. | |
| 2009/0311635 | A1 | 12/2009 | Chen et al. | |
| 2009/0317644 | A1 | 12/2009 | Heller et al. | |
| 2010/0001402 | A1 | 1/2010 | Meyer | |
| 2010/0301495 | A1 | 12/2010 | Chikaki | |
| 2011/0306214 | A1 * | 12/2011 | Zin | 438/714 |
| 2013/0005147 | A1 * | 1/2013 | Angyal et al. | 438/692 |

* cited by examiner

*Primary Examiner* — Charles Garber
*Assistant Examiner* — Stanetta Isaac
(74) *Attorney, Agent, or Firm* — Schmeiser, Olsen & Watts; Parashos Kalaitzis

(57) ABSTRACT

A method for forming small dimension openings in the organic masking layer of tri-layer lithography. The method includes forming an organic polymer layer over a semiconductor substrate; forming a silicon containing antireflective coating on the organic polymer layer; forming a patterned photoresist layer on the antireflective coating, the patterned photoresist layer having an opening therein; performing a first reactive ion etch to transfer the pattern of the opening into the antireflective coating to form a trench in the antireflective coating, the organic polymer layer exposed in a bottom of the trench; and performing a second reactive ion etch to extend the trench into the organic polymer layer, the second reactive ion etch forming a polymer layer on sidewalls of the trench, the second reactive ion etch containing a species derived from a gaseous hydrocarbon.

33 Claims, 7 Drawing Sheets

METHOD FOR FORMING SMALL DIMENSION OPENINGS IN THE ORGANIC MASKING LAYER OF TRI-LAYER LITHOGRAPHY

FIELD OF THE INVENTION

The present invention relates to the field of integrated circuit manufacture; more specifically, it relates to a method for forming small dimension openings in the organic masking layer of tri-layer lithography.

BACKGROUND

As the dimensions of integrated circuit wiring has decreased, it has become increasing difficult to reliably form the via portions of dual damascene wires decreasing both reliability and yield. Accordingly, there exists a need in the art to mitigate the deficiencies and limitations described hereinabove.

SUMMARY

A first aspect of the present invention is a method, comprising: forming an organic polymer layer over a semiconductor substrate; forming a silicon containing antireflective coating on the organic polymer layer; forming a patterned photoresist layer on the antireflective coating, the patterned photoresist layer having an opening therein; performing a first reactive ion etch to transfer the pattern of the opening into the antireflective coating to form a trench in the antireflective coating, the organic polymer layer exposed in a bottom of the trench; and performing a second reactive ion etch to extend the trench into the organic polymer layer, the second reactive ion etch forming a polymer layer on sidewalls of the trench, the second reactive ion etch containing a species derived from a gaseous hydrocarbon.

A second aspect of the present invention is a method, comprising: forming a dielectric layer over a semiconductor substrate, a damascene wire in said dielectric layer, a barrier layer on said dielectric layer and said damascene wire, an inter-level dielectric layer on said barrier layer, a hardmask layer on said inter-level dielectric layer, a patterned hardmask layer having a first opening therein on said hardmask layer, an organic polymer layer on said patterned hardmask layer, a silicon containing antireflective coating on said organic polymer layer, and a patterned photoresist layer having a second opening therein on said antireflective coating; performing a first reactive ion etch to transfer the pattern of said second opening into said antireflective coating; performing a second reactive ion etch to extend said second opening into said organic polymer layer and remove said patterned photoresist layer, said second reactive ion etch forming a polymer layer on sidewalls of said second opening, said second reactive ion etch containing a species derived from a gaseous hydrocarbon; performing a third reactive ion etch to form a via trench through said hardmask layer into but not through said dielectric layer in the bottom of said second opening; removing said organic polymer layer and said polymer layer; performing a fourth reactive ion etch to said via trench through said interlevel dielectric layer and said barrier layer to said damascene wire and to form a wire trench extending through said hardmask layer in said first opening and into, but not through said interlevel dielectric layer; and forming a dual damascene wire in said via and wire trenches, said patterned hardmask layer and hardmask layer removed during said forming said dual damascene wire.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Figure 1A:
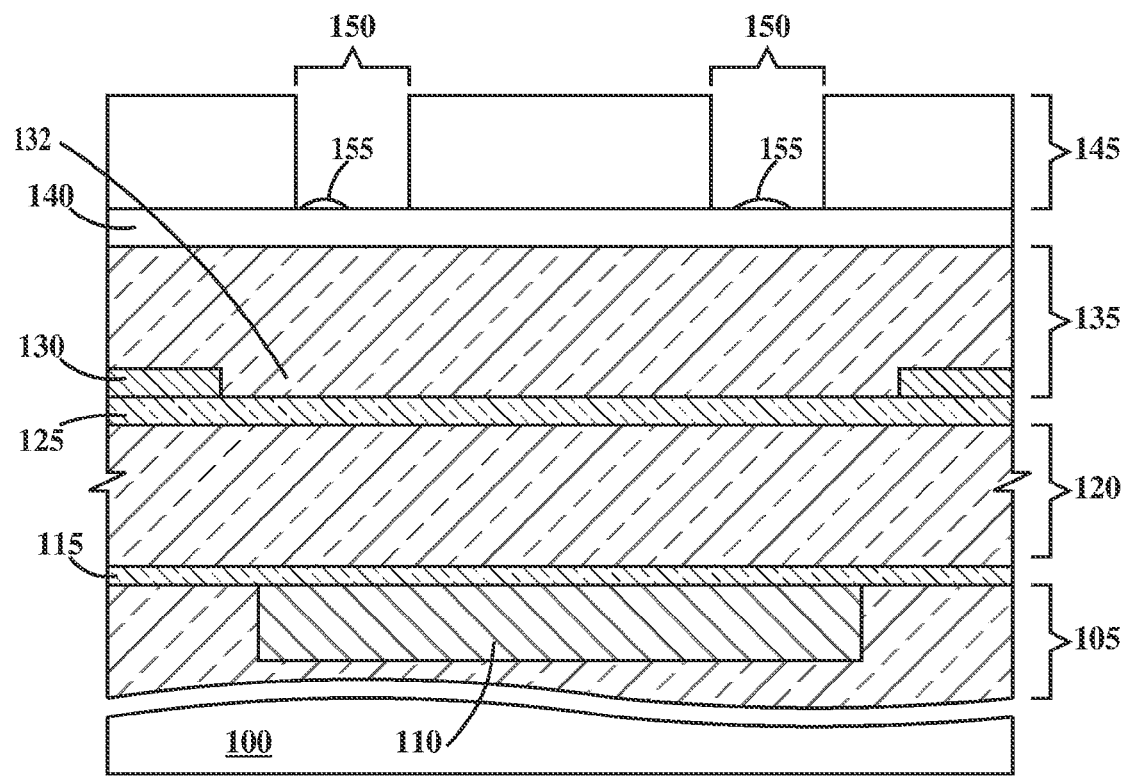
FIGS. 1A through 1I are cross-sectional views illustrating fabrication of dual damascene wires according embodiments of the present invention.

Tri-layer lithography utilizes a photoresist layer on an antireflective coating on an organic polymer layer that may or may not be photoactive. One method of reducing semiconductor dimensions in integrated circuits is called shrinking, wherein all geometric dimensions of features of a previous integrated circuit design are uniformly shrunk (i.e., reduced) to generate a new design. However, because of the limitations of photolithography the very small via images required by the shrink are difficult to print. The embodiments of the present invention address this problem by allowing wider openings to be printed and then non-lithographically reducing the via opening widths during subsequent etch processes.

A dual damascene process will be used to describe the method of the present invention, but the invention is not limited to dual damascene processes but may be applied to forming small features at any level of an integrated circuit including those used to form devices such as transistors and those used to form interconnections between devices. The exemplary dual damascene process used in describing the present invention pre-forms a patterned hardmask for an interlevel dielectric layer wire trench and then forms the layers of a tri-layer photolithography process over the patterned hardmask. The tri-layers are used to define self aligned via openings (the small dimension openings) in the inter-level dielectric layer. After the wire trenches and via opening are formed in the inter-level dielectric layer an electrical conductor of sufficient thickness to fill the trenches and via opening is formed on a top surface of the dielectric and a CMP process is performed to make the surface of the conductor in the trench co-planar with the surface of the dielectric layer to form dual-damascene wires having integral vias.

A photolithographic process is one in which a photoresist layer is applied to a surface of a substrate, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After processing (e.g., an etch), the patterned photoresist is removed. Processing results in a physical change to the substrate. The photoresist layer may optionally be baked at one or more of the following steps: prior to exposure to actinic radiation, between exposure to actinic radiation and development, after development.

All reactive ion etch (RIE) process conditions are given for, but not limited to, tools processing 300 mm diameter wafers. All reactive ion etch (RIE) process conditions are given for an RIE tool having an upper and lower plate where the wafer is placed between the upper and lower plates, with the top surface of the wafer facing the upper plate. There are two methods of determining when to stop an RIE etch. The first method is a timed etch which is used when only a small percentage of the total area of the layer being etched is exposed to the RIE. The second method is called endpoint detect which is used when a large percentage of the total area of the layer being etched is exposed to the RIE. When specific RIE processes are indicated as timed or endpoint detect RIE, they are to be considered exemplary.

FIGS. 1A through 1I are cross-sectional views illustrating fabrication of dual damascene wires according to embodiments of the present invention. In FIG. 1A, a semiconductor substrate 100 (e.g., a bulk silicon substrate or a silicon on insulator (SOI)) is provided. Substrate 100 includes devices such a field effect transistors (FETs) and bipolar transistors. Formed on substrate 100 is a dielectric layer 105 having as damascene wire 110 formed therein. A top surface of wire 110 is coplanar with a top surface of dielectric layer 105. Formed on the top surfaces of wire 110 and dielectric layer 105 is a barrier layer 115. In one example barrier layer 115 is a diffusion barrier to copper. Formed on a top surface of barrier layer 115 is an inter-level dielectric layer (ILD) 120. Formed on a top surface of ILD 120 is a dielectric hardmask layer 125. Formed on a top surface of hardmask layer 125 is a patterned hardmask layer 130 having a (first) opening 132. Formed on a top surface of patterned hardmask layer 130 and on a region of the top surface of hardmask layer 125 not covered by patterned hardmask layer 130 is an organic polymer planarization layer (OPL) 135. Formed on a top surface of OPL 135 is a SiARC (Si antireflective coating) 140. Formed on a top surface of SiARC 140 is a patterned photoresist layer 145 having (second) openings 150 formed therein. Regions of the top surface of SiARC 140 are exposed in the bottom of openings 150. In the example of FIG. 1A, within openings 150 are photoresist residuals 155 on the top surface of SiARC 140. These residuals may or may not be present in all cases.

Opening 132 will be used in subsequent operations to define a wire trench that, when filled with an electrical conductor, will form the wire portion of a dual damascene wire. Openings 150 will be used in subsequent operations to define via trenches (designed as squares or rectangles) that, when filled with the electrical conductor, will form the via portion the dual damascene wire.

In one example, wire 110 comprises a core conductor (e.g., copper (Cu)) having an electrically conductive liner on sidewalls and a bottom surface of the core conductor. In one example the liner comprises a layer of tantalum (Ta) on sidewalls and a bottom surface of the core conductor and a layer of tantalum nitride (TaN) on the Ta layer. In one example the liner comprises a layer of titanium (Ti) on sidewalls and a bottom surface of the core conductor and a layer of titanium nitride (TiN) on the Ti layer. In one example, dielectric layer 105 and ILD 120 independently comprise a low K (dielectric constant) material, examples of which include but are not limited to hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), and porous SiCOH. In one example, barrier layer 115 is NBLok (SiC(N, H)). In one example, barrier layer 115 is a low K material. A low K dielectric material has a relative permittivity of about 2.7 or less. In one example, hardmask layer 125 is tetraethyl orthosilicate (TEOS) oxide. The material of patterned hardmask layer 130 is selected to be resistance to the etch process that will be used to etch hardmask layer 125 and ILD layer 120 in subsequent operations. In one example, patterned hardmask layer 130 is TiN. In one example, OPL 135 comprises polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques. In one example, SiARC 140 comprises a silicon-containing ARC commercially available as Sepr-Shb Aseries SiARC from Shin Etsu Chemical Co., Ltd. which may be applied using spin coating technology or a vapor deposition process.

In one example, barrier layer 115 is about 15 nm to about 25 nm thick. In one example ILD layer 120 is between about 50 nm and about 300 nm thick. In one example, hardmask layer 125 is about 15 nm to about 25 nm thick. In one example, patterned hardmask layer 130 is about 25 nm to about 505 nm thick. In one example, OPL 135 is about 150 nm to about 250 nm thick. In one example, SiARC 140 is about 25 nm to about 50 nm thick.

Figure 1B:
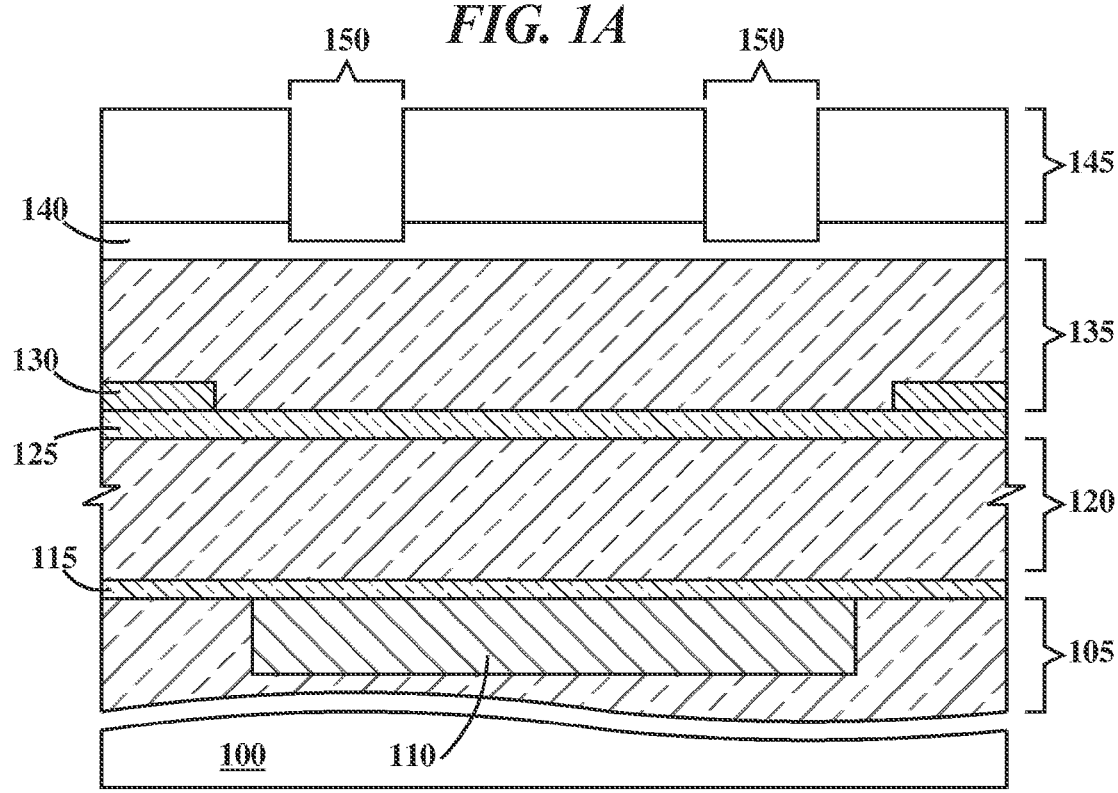

In FIG. 1B, a photoresist cleanup RIE (also known as a descum RIE) is performed to remove any photoresist residuals (i.e., residuals 155 of FIG. 1A) which also extends openings 150 partially into SiARC 140. In one example, the photoresist cleanup RIE comprises an RIE of about 5 seconds at about 20 mTorr, with an upper plate radio frequency (RF) power of about 500 watts and a lower plate RF power of about 75 watts using HBr at about 30 sccm, $O_2$ at about 40 sccm, $CO_2$ at about 80 sccm and He at about 200 sccm. Alternatively, the $HBr/O_2/CO_2$/He chemistry can be replaced with a $CO_2/N_2$ or $N_2/N_2$ chemistries.

Figure 1C:
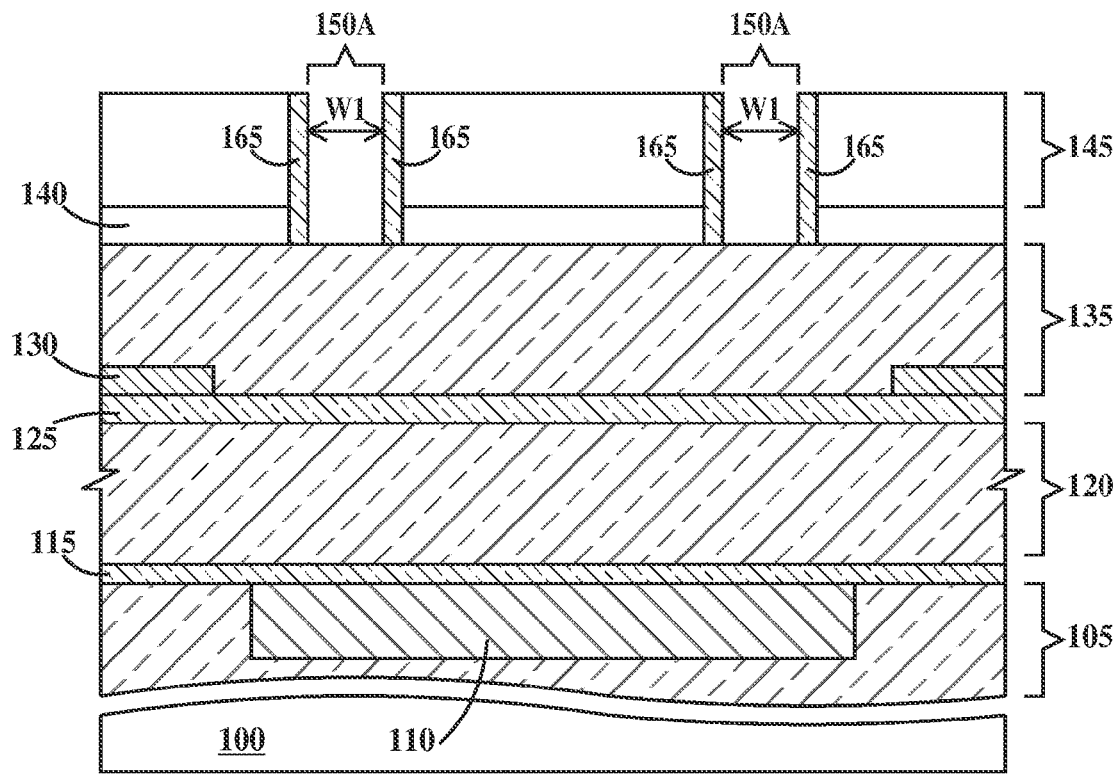

In FIG. 1C, a SiARC RIE is performed. The SiARC RIE extends openings 150 to the top surface of OPL 135. The SiARC RIE deposits polymer layers 165 on the sidewalls of openings 150. In one example, polymer layers 165 have a thickness of about 2 nm to about 10 nm. In one example, the SiARC RIE comprises an RIE at about 15 mTorr, with an upper plate RF power of about 500 watts and a lower plate RF power of about 100 watts using $C_4F_8$ at about 10 sccm, $CF_4$ at about 80 sccm and $CHF_3$ at about 50 sccm. The SiARC RIE is selective to OPL 135 (does not significant etch OPL 135). In the example of FIG. 1C, the SiARC RIE is an endpoint detect RIE. Formation of polymer layer 165 on the sidewalls of opening 150 (see FIG. 1B) forms an opening 150A having a width W1. In one example, W1 is about 40 nm to about 70 nm.

Figure 1D:
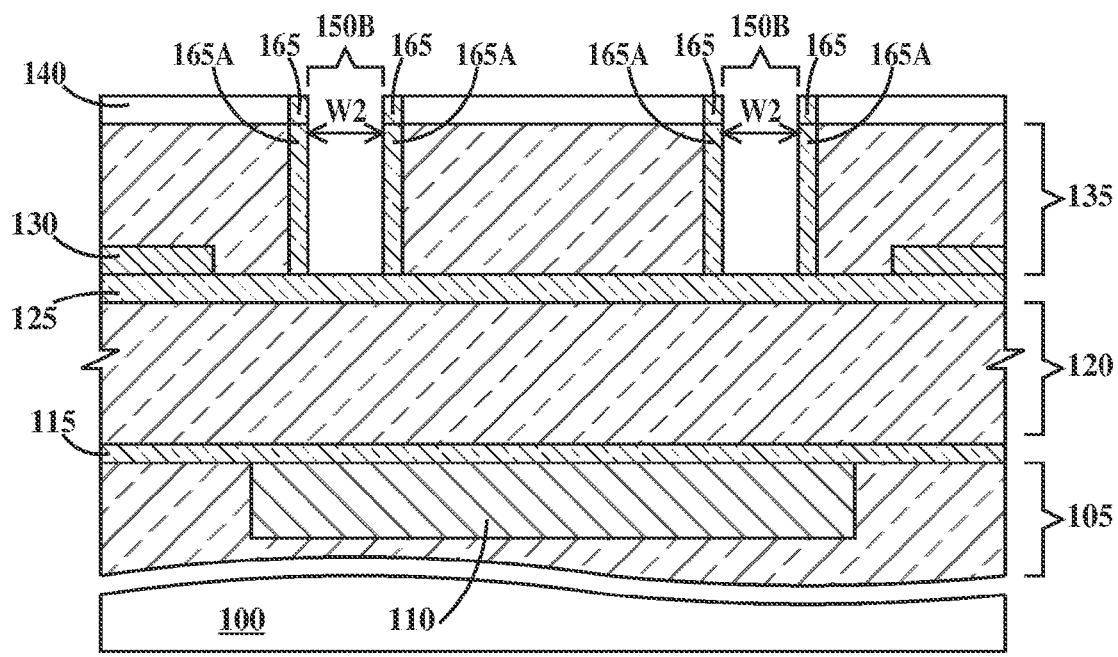

In FIG. 1D, an OPL RIE is performed that (i) extends openings 150 through OPL layer to hardmask layer 125, (ii) removes photoresist layer 145 (see FIG. 1C) and (iii) forms polymer layers 165A on the sidewalls of OPL layer 135 in openings 150. It is critical to the operation of the present invention that the OPL RIE includes a carbon containing species derived from a gaseous hydrocarbon and generates polymer 165A as it is this polymer that reduces the width of the via trenches that will be formed in subsequent operations through hardmask layer 125, ILD layer 120 and barrier layer 115. These subsequently formed trenches will define the width of the via portions of the dual damascene wire having shrink dimensions not otherwise obtainable by photolithography alone. It is also critical to the operation of the invention, that the OPL RIE does not include a fluorine containing species as that would etch the TiN patterned hardmask layer 130 causing blow up and non-self aligned vias when openings 150 are not fully within the perimeter of opening 130 and effectively "un-shrinking" the dimensions of the vias. See FIGS. 2B, 2C and 2D. The OPL RIE is selective to SiARC 140 (does not significantly etch SiARC 140). In one example, the OPL RIE comprises an endpoint detect RIE at about 20 mTorr, with an upper plate RF power of about 500 watts and a lower plate RF power of about 150 watts using HBr at about 60 sccm, $O_2$ at about 40 sccm, $CO_2$ at about 80 sccm, He at about 175 sccm and $C_2H_4$ at about 25 sccm. In this example, the hydrocarbon is ethylene and comprises about 5.2% by volume of all gases of the OPL RIE process. More generally, the gaseous hydrocarbon comprises about 1% to about 20% by volume of all gases of the OPL RIE with about 1% to about 10% preferred. gaseous hydrocarbon is a hydrocarbon that is a gas a standard temperature and pressure (STP, i.e., 0° C. and 1 atmosphere). Suitable gaseous hydrocarbons include but are not limited to methane, ethane, propane, ethylene, acetylene, propene and propyne (chemical formula $C_3H_4$ also known as methylacetylene or its isomer propadiene). Hardmask layer 125 and patterned hardmask layer 130 act as an etch stop for the OPL RIE etch. Alternatively, the $HBr/O_2/CO_2/He$/hydrocarbon chemistry can be replaced with a $CO_2/N_2$/hydrocarbon or $N_2/N_2$/hydrocarbon chemistries. Formation of polymer layer 165A on the sidewalls of opening 150 (see FIG. 1B) forms an opening 150B having a width W2. The OPL etch chemistry can be tuned to control of the amount shrinking of the OPL etched images. W1 (see FIG. 1C) is always greater than W2. In one example, W2 is about 30 nm to about 60 nm. In one example, W1–W2 is greater than or equal to about 10 nm. In one example, W1–W2 is greater than zero but less than about 10 nm.

Figure 1E:
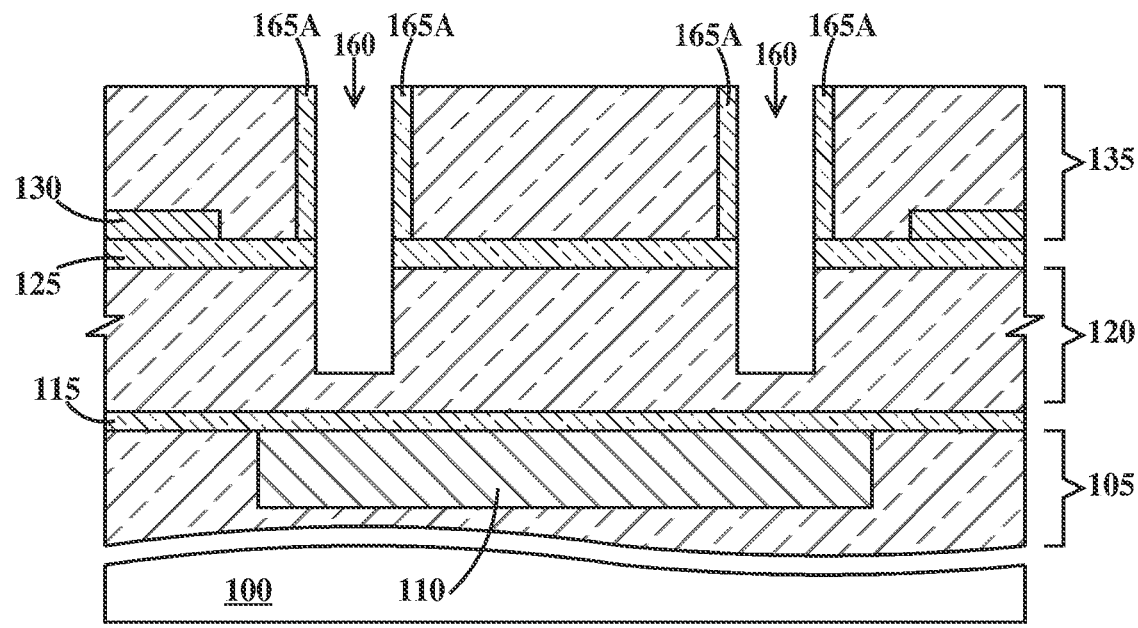

In FIG. 1E, a hardmask RIE is performed to form trenches via 160 through hardmask layer 125 and into ILD layer 115. The hardmask RIE also removes any remaining SiARC layer 140 (see FIG. 1D). In one example, the hardmask RIE comprises a RIE of about 30 seconds at about 40 mTorr, with an upper plate RF power of about 0 watts and a lower plate RF power of about 500 watts using $CF_4$ at about 200 sccm and Ar at about 450 sccm. Though via trenches 160 are show as not extending all the way through ILD layer 120 to barrier layer 115, alternatively the hardmask RIE may extend trenches all the way through ILD layer 120 to barrier layer 115.

Figure 1F:
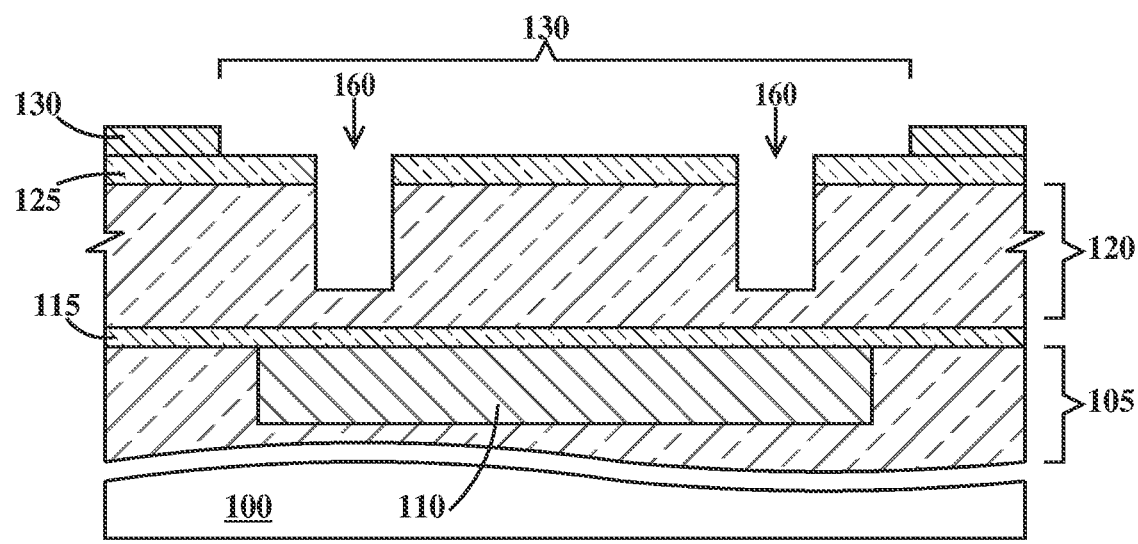

In FIG. 1F, an OPL removal plasma strip (e.g., using $O_2$) is performed to remove any remaining OPL 135 (see FIG. 1E). This exposes opening 132 in patterned hardmask layer 130.

Figure 1G:
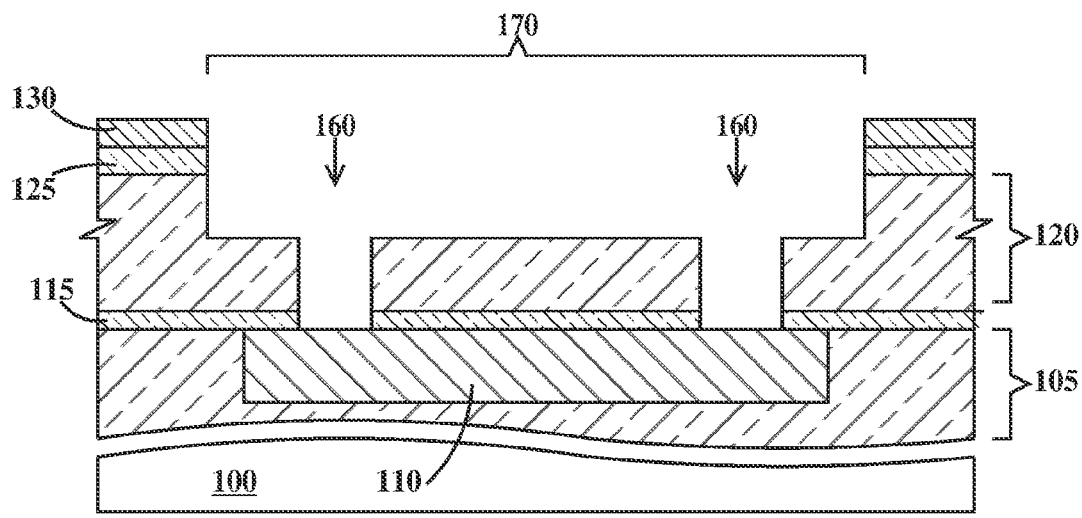

In FIG. 1G, hardmask layer 125 not protected by patterned hardmask layer 130F) is etched away and a wire trench 170 formed in ILD layer 120 and via trenches 160 are extended through ILD layer 120 and through barrier layer 115 to wire 110.

Figure 1H:
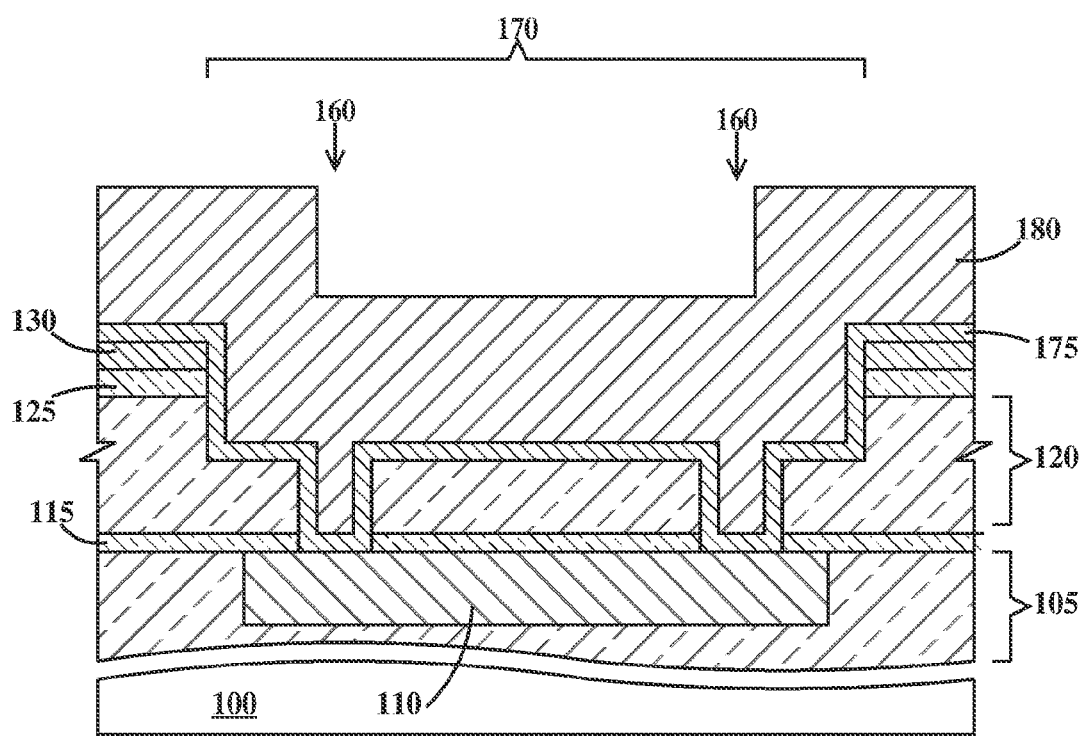

In FIG. 1H an electrically conductive liner 175 is conformally deposited on exposed surfaces patterned hardmask layer 130, hardmask layer 125, ILD layer 120m barrier layer 115 and wire 110 in via trenches 160 and 170A and a core conductor 180 formed on a top surface of liner 175. Core conductor 180 completely fills remaining spaces in trenches 160 and 170. In one example, liner 175 comprises a first formed layer of TaN and a second formed layer of Ta or a first formed a layer of TiN and a second formed layer of Ti. In one example, core conductor comprises Cu. Core conductor may be formed by evaporating a thin conformal seed Cu layer on liner 175, followed by electroplating a thick layer of Cu.

Figure 1I:
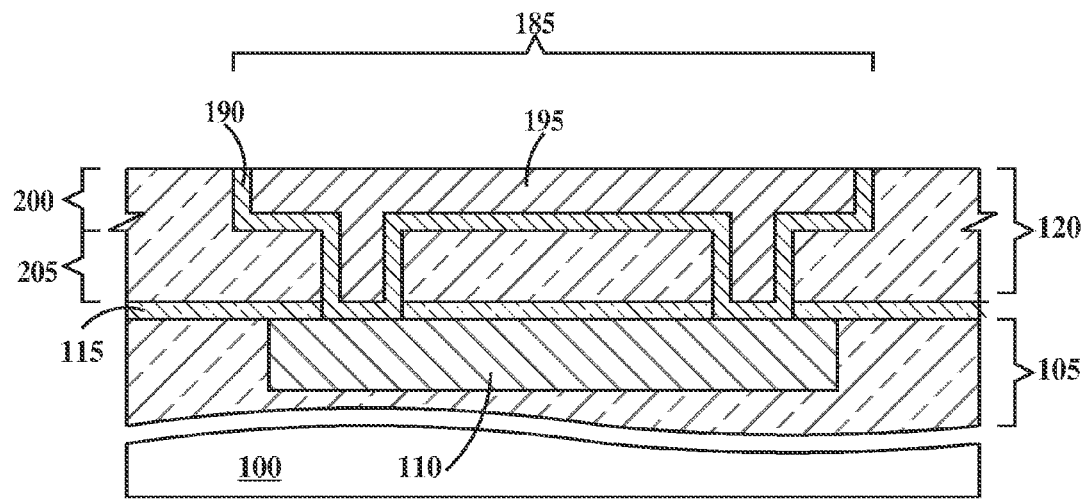

In FIG. 1I, a chemical-mechanical-polish is performed to remove excess core conductor 180, excess liner 175, patterned hardmask layer 130 and hardmask layer 125 to form a dual-damascene wire 185 comprised of an electrically conductive liner 190 and a core conductor 195. Dual damascene wire 185 includes a wire portion 200 and integral via portions 205.

Figure 2A:
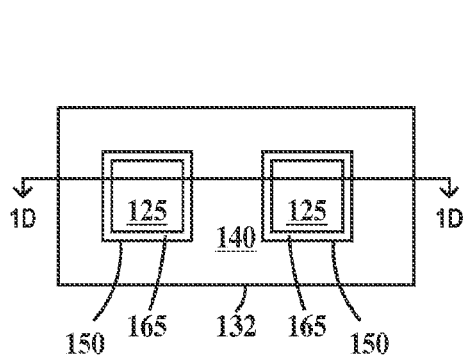
FIGS. 2A and 2B are alternate top views of the section of FIG. 1D.
Figure 2B:
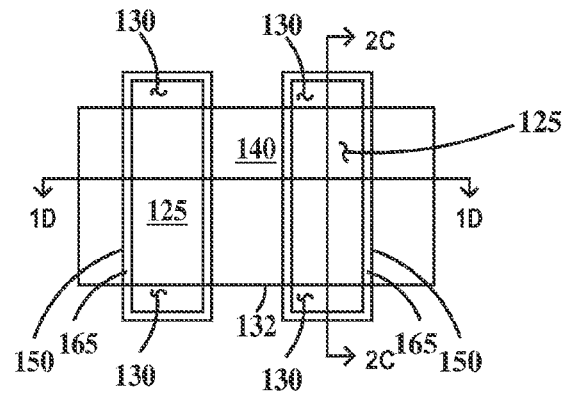

FIGS. 2A and 2B are alternate top views of the section of FIG. 1D. In FIG. 2A, openings 150 (that will define via trenches 160, see FIG. 1E) are contained within the perimeter of opening 132 (that will define wire trench 170, see FIG. 1G). In FIG. 2B, openings 150 (that will define via trenches 160, see FIG. 1E) extend past the perimeter of opening 132 (that will define wire trench 170, see FIG. 1G) on two opposing sides, exposing patterned hardmask layer 130.

Figure 2C:
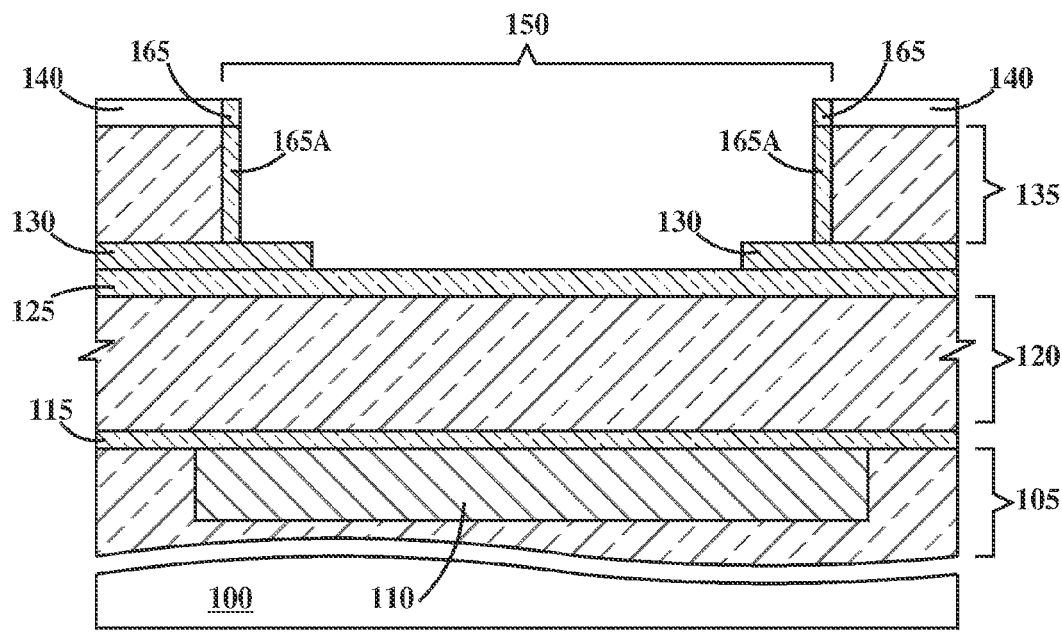
FIG. 2C is a cross-section view through line 2C-2C of FIG. 2B.

FIG. 2C is a cross-section view through line 2C-2C of FIG. 2B. FIG. 2C is similar to FIG. 1D except for the direction of the section which is perpendicular and in the same plane as that of FIG. 1D. Again. in FIG. 2C, openings 150 (that will define via trenches 160, see FIG. 1E) extend past the perimeter of opening 132 (that will define wire trench 170, see FIG. 1G) on two opposing sides, exposing patterned hardmask layer 130. Since patterned hardmask 130 will act as an etch stop to the etching of hardmask layer 125, patterned hardmask layer prevents the via portion from overlapping the wire portion of the dual damascene wire that will be formed in subsequent operations.

Figure 2D:
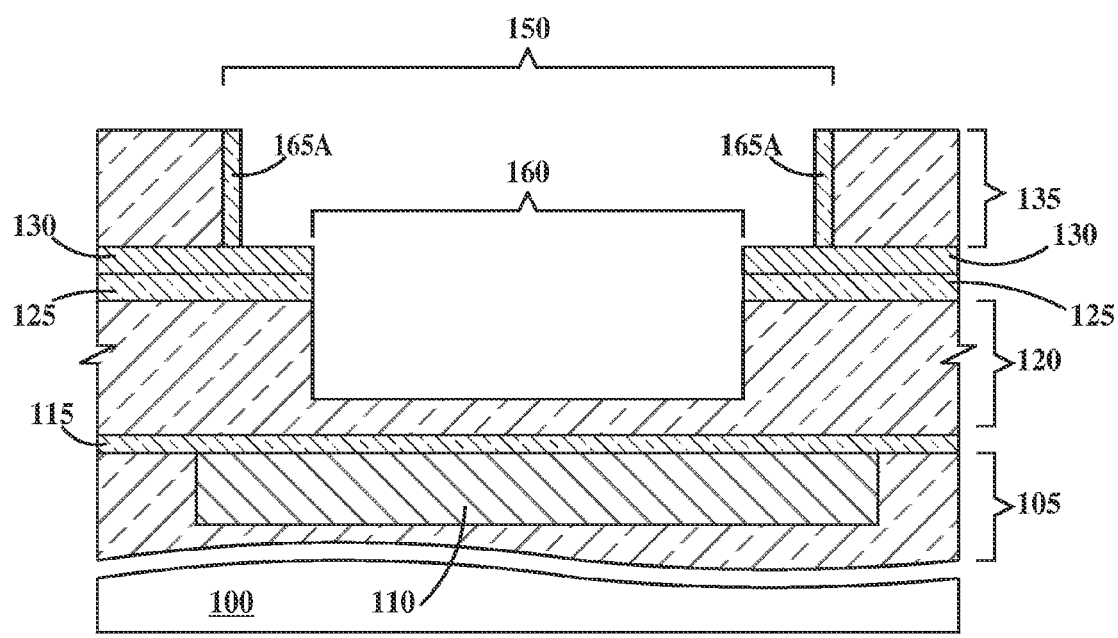
FIG. 2D is a cross-section view of FIG. 2C after further processing.

FIG. 2D is a cross-section view of FIG. 2C after further processing. FIG. 2D is similar to FIG. 1E except for the direction of the section which is perpendicular and in the same plane as that of FIG. 1E. FIG. 2C clearly shows that the via trench does not "blow-out" because patterned hardmask layer 130 prevents the etching of hardmask layer 125 and both can act as an etch stop for etching ILD 120.

Figure 3:
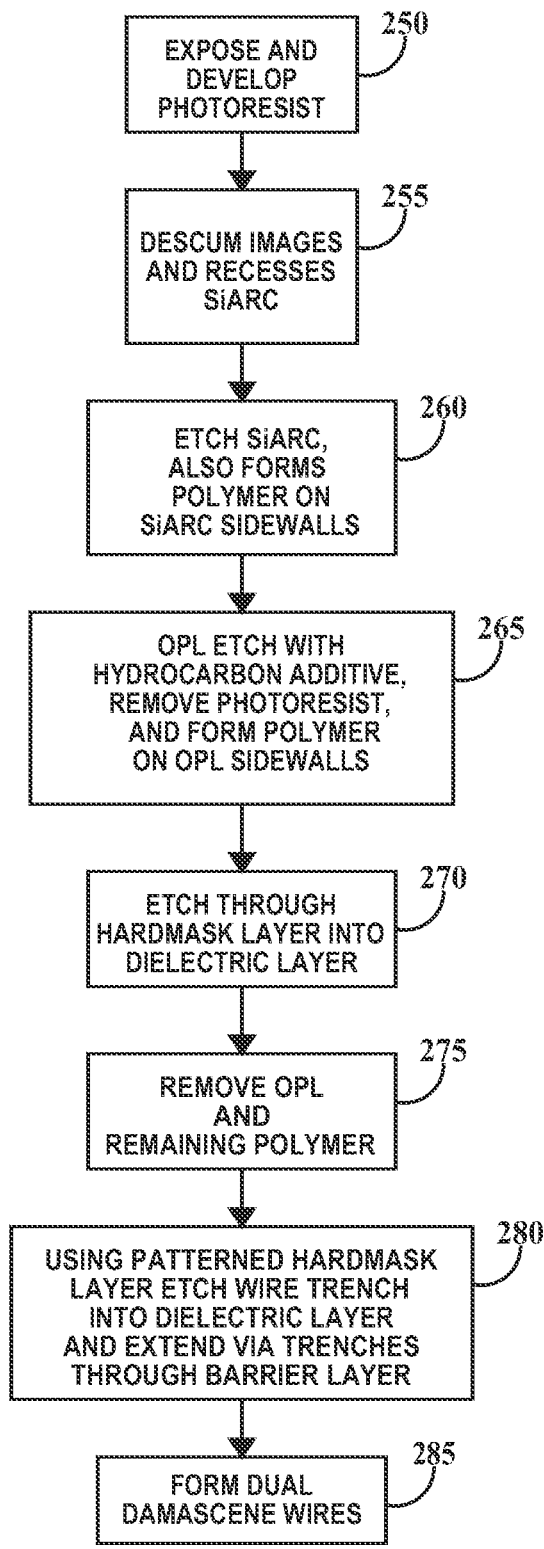
FIG. 3 is a flowchart of the method of fabricating damascene wires according to embodiments of the present invention.

FIG. 3 is a flowchart of the method of fabricating damascene wires according to embodiments of the present invention. In step 250, a photoresist layer is exposed and developed to form images in the photoresist layer 145 as illustrated in FIG. 1A. In step 255, a descum processes is performed to remove any residual photoresist in the images and form a recess in SiARC layer as illustrated in FIG. 1B. In step 260, openings are etched (the recess is extended) through the SiARC layer to an underlying OPL as illustrated in FIG. 1C. Polymer is also formed on the sidewalls of SiARC trenches. In step 265, the underlying OPL is etched to extend the openings through the OPL to an underlying hardmask layer as illustrated in FIG. 1D. The photoresist layer is removed, the SiARC is thinned and a polymer is formed on the sidewalls of the OPL trenches. In step 270, the openings are extended through the underlying hardmask layer and into an underlying ILD layer to form via trenches in the ILD layer as illustrated in FIG. 1E. In step 275, the OPL is removed as illustrated in FIG. 1F. In step 280, using an opening in a patterned hardmask layer (exposed after step 275) that was disposed between the hardmask layer and the OPL a wire trench is etched partially through the ILD layer and the via trenches are extended through an underlying barrier layer to a wire in an underlying dielectric layer as illustrated in FIG. 1G. In step 285, a dual damascene wire is formed in the wire and via trenches in the ILD layer as illustrated in FIGS. 1H and 1G.

In comparative experiments, an OPL RIE etch process that did not use hydrocarbon containing chemistry (and contained no fluorine) did not reduce the via trench width dimension (W1 and W2 were both about 60 nm so W1−W2=0) while an OPL RIE process that used a hydrocarbon containing chemistry reduced (and contained no fluorine) reduced the via trench width dimension by about 10 nm on a side (W1 was about 60 nm and W2 was about 40 nm). See FIG. 1A for where W1 is measured and FIG. 1G where W2 is measured. Further, in OPL RIE processes that did not use hydrocarbon containing chemistries (and contained no fluorine) the via trench width dimension significantly increased with overetch in the OPL RIE of FIG. 1D (almost linearly at a slope of about 45°) while in OPL RIE processes that used hydrocarbon containing chemistries (and contained no fluorine) the via trench width dimension did not significantly increased with OPL RIE overetch time. The OPL RIE processes of the present invention maintained its "shrink via trench width" to at least about 125% overetch. Not only does the present invention provide significant non-photolithographic shrinking, but is highly insensitive to overetch of the layer that the via trenches are being etched into.

Thus, the embodiments of the present invention provides a method of forming the forming small dimension openings in the organic polymer layer of a tri-layer photolithographic process by adding a gaseous hydrocarbon to the organic polymer layer etch to automatically form sidewall polymers to reduce the dimensions of the via openings etched into the inter-level dielectric layer.

Further, the embodiments of the present invention provides a method of forming the via portions of dual damascene wires by adding a hydrocarbon to the organic polymer layer etch of a tri-layer photolithographic process to automatically form sidewall polymers to reduce the dimensions of the via openings etched into the inter-level dielectric layer.

The present invention was described in the context of a process employing sidewall polymer formation to shrink the dimensions of the vias of a dual damascene wire. However, OPL/SiARC layers used in conjunction with hydrocarbon containing RIEs may be used to shrink the surface dimensions of single damascene wires and other structures.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
    forming an organic polymer layer over a semiconductor substrate;
    forming a silicon containing antireflective coating on said organic polymer layer;
    forming a patterned photoresist layer on said antireflective coating, said patterned photoresist layer having an opening therein;
    performing a first reactive ion etch to transfer the pattern of said opening into said antireflective coating to form a trench in said antireflective coating, said organic polymer layer exposed in a bottom of said trench; and
    performing a second reactive ion etch to extend said trench into said organic polymer layer, said second reactive ion etch removing said patterned photoresist layer, said second reactive ion etch forming a polymer layer on sidewalls of said trench, said second reactive ion etch containing a species derived from a gaseous hydrocarbon.

2. The method of claim 1, wherein said gaseous hydrocarbon comprises about 1% to about 20% by volume of all gases of said second RIE.

3. The method of claim 1, wherein said gaseous hydrocarbon are selected from the group consisting of methane, ethane, propane, ethylene, acetylene, propene and propyne.

4. The method of claim 1, wherein said second reactive ion etch does not include a fluorine containing species.

5. The method of claim 1, wherein said first reactive ion etch includes a fluorine containing species.

6. The method of claim 1, wherein said second reactive ion etch further includes species derived from hydrogen bromide, oxygen and helium.

7. The method of claim 1, wherein said second reactive ion etch further includes species derived from carbon dioxide and nitrogen.

8. The method of claim 1, wherein said second reactive ion etch further includes species derived from nitrogen and hydrogen.

9. The method of claim 1, wherein a width of said trench measured in a direction perpendicular to a top surface of said substrate is less than a width of said opening measured in said same direction.

10. A method, comprising:
    forming a dielectric layer over a semiconductor substrate, a damascene wire in said dielectric layer, a barrier layer on said dielectric layer and said damascene wire, an inter-level dielectric layer on said barrier layer, a hardmask layer on said inter-level dielectric layer, a patterned hardmask layer having a first opening therein on said hardmask layer, an organic polymer layer on said patterned hardmask layer, a silicon containing antireflective coating on said organic polymer layer, and a patterned photoresist layer having a second opening therein on said antireflective coating;
    performing a first reactive ion etch to transfer the pattern of said second opening into said antireflective coating;
    performing a second reactive ion etch to extend said second opening into said organic polymer layer and remove said patterned photoresist layer, said second reactive ion etch forming a polymer layer on sidewalls of said second opening, said second reactive ion etch containing a species derived from a gaseous hydrocarbon;
    performing a third reactive ion etch to form a via trench through said hardmask layer into but not through said dielectric layer in the bottom of said second opening;
    removing said organic polymer layer and said polymer layer;
    performing a fourth reactive ion etch to said via trench through said interlevel dielectric layer and said barrier layer to said damascene wire and to form a wire trench extending through said hardmask layer in said first opening and into, but not through said interlevel dielectric layer; and
    forming a dual damascene wire in said via and wire trenches, said patterned hardmask layer and hardmask layer removed during said forming said dual damascene wire.

11. The method of claim 10, further including:
    said second reactive ion etch removing said patterned photoresist layer.

12. The method of claim 10, wherein said gaseous hydrocarbon comprises about 1% to about 20% by volume of all gases of said second RIE.

13. The method of claim 10, wherein said gaseous hydrocarbon are selected from the group consisting of methane, ethane, propane, ethylene, acetylene, propene and propyne.

14. The method of claim 10, wherein said second reactive ion etch does not include a fluorine containing species.

15. The method of claim 10, wherein said first reactive ion etch includes a fluorine containing species.

16. The method of claim 10, wherein said second reactive ion etch further includes species derived from hydrogen bromide, oxygen and helium.

17. The method of claim 10, wherein said second reactive ion etch further includes species derived from carbon dioxide and nitrogen.

18. The method of claim 10, wherein said second reactive ion etch further includes species derived from nitrogen and hydrogen.

19. The method of claim 10, wherein a width of said second opening in said patterned photoresist layer measured in a direction perpendicular to a top surface of said substrate is less than a width of said via trench measured in said same direction.

20. The method of claim 10, wherein said via trench is aligned within a perimeter of said first opening.

21. The method of claim 10, wherein at least one side of said via trench extends past a perimeter of said first opening.

22. The method of claim 10, wherein forming said dual damascene wire includes:
   forming an electrical conductive liner layer on the bottom and sidewalls of said first and second trenches and on a top surface of said patterned hardmask layer;
   forming an electrically conductive core conductor layer on said liner layer; and
   performing a chemical-mechanical-polish to remove regions of said liner layer, said core layer, all of said patterned hardmask layer and all of said hardmask layer to form said damascene wire, after said chemical-mechanical-polish a top surface of said dual damascene wire coplanar with a top surface of said interlevel dielectric layer.

23. The method of claim 10, wherein said organic polymer layer is a low K material selected from the group consisting of hydrogen silsesquioxane polymer, methyl silsesquioxane polymer, polyphenylene oligomer, methyl doped silica or $SiO_x(CH_3)_y$, $SiC_xO_yH_y$, organosilicate glass, SiCOH, and porous SiCOH.

24. The method of claim 10, wherein said barrier layer prevents copper diffusion through said barrier layer.

25. A method, comprising:
   forming an organic polymer layer over a semiconductor substrate;
   forming a silicon containing antireflective coating on said organic polymer layer;
   forming a patterned photoresist layer on said antireflective coating, said patterned photoresist layer having an opening therein;
   performing a first reactive ion etch to transfer the pattern of said opening into said antireflective coating to form a trench in said antireflective coating, said organic polymer layer exposed in a bottom of said trench; and
   performing a second reactive ion etch to extend said trench into said organic polymer layer, said second reactive ion etch not including a fluorine containing species, said second reactive ion etch forming a polymer layer on sidewalls of said trench, said second reactive ion etch containing a species derived from a gaseous hydrocarbon.

26. The method of claim 25, further including:
   said second reactive ion etch removing said patterned photoresist layer.

27. The method of claim 25, wherein said gaseous hydrocarbon comprises about 1% to about 20% by volume of all gases of said second RIE.

28. The method of claim 25, wherein said gaseous hydrocarbon are selected from the group consisting of methane, ethane, propane, ethylene, acetylene, propene and propyne.

29. The method of claim 25, wherein said first reactive ion etch includes a fluorine containing species.

30. The method of claim 25, wherein said second reactive ion etch further includes species derived from hydrogen bromide, oxygen and helium.

31. The method of claim 25, wherein said second reactive ion etch further includes species derived from carbon dioxide and nitrogen.

32. The method of claim 25, wherein said second reactive ion etch further includes species derived from nitrogen and hydrogen.

33. The method of claim 25, wherein a width of said trench measured in a direction perpendicular to a top surface of said substrate is less than a width of said opening measured in said same direction.

* * * * *